(12) United States Patent
Schmidt et al.

(10) Patent No.: US 8,344,744 B2
(45) Date of Patent: Jan. 1, 2013

(54) PROBE STATION FOR ON-WAFER-MEASUREMENT UNDER EMI-SHIELDING

(75) Inventors: Axel Schmidt, Thiendorf OT Stölpchen (DE); Botho Hirschfeld, Dresden (DE); Stojan Kanev, Thiendorf OT Sacka (DE); Andrej Rumiantsev, Dresden (DE); Michael Teich, Moritzburg OT Friedewald (DE)

(73) Assignee: Cascade Microtech, Inc., Beaverton, OR (US)

( * ) Notice: Subject to any disclaimer, the term of this patent is extended or adjusted under 35 U.S.C. 154(b) by 233 days.

(21) Appl. No.: 12/818,442

(22) Filed: Jun. 18, 2010

(65) Prior Publication Data
US 2011/0227602 A1    Sep. 22, 2011

(30) Foreign Application Priority Data
Mar. 18, 2010   (DE) .................... 20 2010 003 817 U

(51) Int. Cl.
*G01R 31/00*        (2006.01)
(52) U.S. Cl. .......... 324/750.27; 324/750.19; 324/750.26
(58) Field of Classification Search .......... 324/750.19–750.21, 750.26–750.29, 324/754.08–754.09, 756.01–756.02
See application file for complete search history.

(56) References Cited

U.S. PATENT DOCUMENTS

| | | | | |
|---|---|---|---|---|
| 4,695,707 A | * | 9/1987 | Young | 219/392 |
| 4,797,614 A | * | 1/1989 | Nelson | 324/236 |
| 6,002,263 A | * | 12/1999 | Peters et al. | 324/750.27 |
| 6,407,542 B1 | * | 6/2002 | Conte | 324/750.26 |
| 7,046,025 B2 | * | 5/2006 | Schneidewind et al. | 324/750.03 |
| 7,071,713 B2 | * | 7/2006 | Furukawa et al. | 324/750.19 |
| 7,173,440 B2 | * | 2/2007 | Kishida | 324/750.26 |
| 7,235,990 B1 | * | 6/2007 | Kreissig et al. | 324/750.27 |
| 7,659,743 B2 | * | 2/2010 | Kanev et al. | 324/757.03 |
| 8,278,951 B2 | * | 10/2012 | Kanev et al. | 324/750.19 |
| 2008/0116918 A1 | * | 5/2008 | Kanev et al. | 324/754 |

FOREIGN PATENT DOCUMENTS
DE    19638816 A1    3/1998
DE    102007053862 A1    6/2008

OTHER PUBLICATIONS

English-language abstract of German Patent No. 19638816 A1, Mar. 26, 1998.
English-language abstract of German Patent No. 102007053862 A1, Jun. 12, 2008.

* cited by examiner

*Primary Examiner* — Joshua Benitez Rosario
(74) *Attorney, Agent, or Firm* — DASCENZO Intellectual Property Law, P.C.

(57) ABSTRACT

An arrangement is provided for testing DUTs with a chuck that has a support surface for supporting of a DUT as well as for supplying the support surface with a defined potential, or for connecting the DUT. The arrangement further includes a positioning device for positioning the chuck as well as an electromagnetic shielding housing enclosing at least the chuck. Inside the housing and adjacent to the chuck, a signal preamplifier is arranged whose signal port facing the chuck is electrically connected with the support surface, wherein the signal preamplifier is moveable together with the chuck by the positioning device in a way that it holds its position constant relative to the chuck during positioning. The signal preamplifier is connected to a measurement unit outside of the housing via a measurement cable.

9 Claims, 2 Drawing Sheets

PROBE STATION FOR ON-WAFER-MEASUREMENT UNDER EMI-SHIELDING

CROSS-REFERENCE TO RELATED APPLICATIONS

This application claims priority of German application No. 20 2010 003817.0 filed on Mar. 18, 2010, the entire disclosure of which is hereby incorporated herein by reference.

FIELD OF THE INVENTION

The invention relates in general to a probe station for measuring electronic semiconductor substrates of a wafer, so called on-wafer-measurements. Specifically, it relates to on-wafer-measurements in the range of low currents and voltages, i.e. the low-current and low-voltage-areas.

BACKGROUND OF THE INVENTION

For the development and manufacturing of semiconductor substrates, it is necessary to carry out various tests and assessments during the different stages of production specifically for semiconductor substrates that are part of a wafer. As is known, the probe stations which basically comprise a chuck with a support surface which supports the devices under test (DUT) on the semiconductor substrates to be measured, are used for those tests. The chuck is mostly movable in x- and y-directions. Further, the probe station has a probe support with sensors, also called probes, to electrically contact the devices under test (DUT). For producing the electrical contacts, a relative movement in z-direction between the probes and the devices under test is necessary besides the movability in the x-y plane, which is consistently defined as the plane in which the support surface of the chuck is located. The required movements in z-direction are mostly realizable in connection with a positioning device of the probe support.

Because small leakage currents within the mentioned measurement range already lead to a distortion of measurement results, a probe station has a shielding system through which the electromagnetic interference can be minimised. With conventional probe stations, the EMI shielding system is made of a housing of electrically conductive materials in which at least the chuck or other devices for supporting the semiconductor substrates, including their positioning device as well as devices for incorporating and positioning of the probes are arranged, and therefore are shielded from electromagnetic and optical interferences. The external interfaces of the shielding are the cables of the measurement instruments that comprise the devices to control and analyse measurements.

Often in addition to the housing, a triaxial formation of the measurement instruments is realized. At the same time, two shields which consist of electrically conductive material are arranged opposite, i.e. adjacent to the support surface of the chuck. The outer components, e.g. the wall of the housing, serves for EMI-shielding and the element in the middle, e.g. the inside encasing or shield, serves as a so called guard. The guard is kept at the same potential as the DUT, so that even a very low, measurement results distorting, leakage current is avoided between those two elements (See DE 19638816 A1).

The chuck also has such a triaxial formation. In this case, the support surface of the chuck on which the substrate lies and which is at least electrically conductive in some sections, is kept at a force-potential. The guard which is separated from the support surface by an insulating layer extends underneath the support surface. The shield—also electrically insulated from the guard—is underneath the guard. The support surface, the guard and the shield can be realized in form of differently conductive layering with insulating layers lying in-between, whereas the shield is connected to ground, mostly to the housing or is carried out floating, and the guard is kept at a potential that is at least nearly consistent with the force-potential but decoupled from it. In this way, the wafer is efficiently shielded from interfering sources that are in the proximate surrounding of the wafer such as the drives of the positioning device of the chuck.

Also, components of the signal transmission can be included in the shielding system. The signal preprocessing devices which prepare the measurement signals from the probes for the transmission are arranged within the housing in separate chambers which again are electrically shielded from the devices under test through their walls (See DE 102007053862 A1).

For measuring the devices under test, a defined arrangement of probes, mostly consistent with the density and the size of the contact pads to be contacted of the device under test as well as consistent with probes adjusted to the measurement signal, is placed on several contact pads at the same time and through the probes electrically connected to measurement devices for measuring the properties of the device under test. By means of the probes, the device under test can be supplied with a signal, or a signal can be picked up from a device under test.

As devices under test, various semiconductor substrates are suitable which are often still on the wafer. With such on-wafer-measurements, the rear side of the wafer that rests on the chuck is often connected as well to receive the signals from rear sided electrical contacts, or to feed them into those, or the rear side of the wafer is energized by a defined potential during the measurement. That takes place via the support surface of the chuck by electrically connecting the entire surface or certain contact areas with the measurement device.

SUMMARY OF THE INVENTION

The probe station of the present invention serves to improve the noise performance of such on-wafer-measurements in which the wafer rear is electrically connected via the support surface.

For that reason, a signal preamplifier, through which signals between the sheet-like contact on the support surface of the chuck and a measurement device outside the housing can be transmitted in both directions, is arranged in the probe station within the housing and thus, within the shielding system. A signal preamplifier shall be understood to be an amplifier which alters a signal quantitatively to increase the signal-to-noise ratio. Qualitative processing of the signal can be added, e.g. filtering.

In the housing, the signal preamplifier is arranged adjacent to the chuck and in a constant relative position therebetween, i.e. in the same position relative to the chuck independent of possible movements of the chuck, e.g. for its positioning. In this way, the section of the electrical connection in direction of the measurement device, in which the lowest signals must be transmitted, are for one thing stabilized and for another thing significantly shortened. Because there is no movement between the chuck and the signal preamplifier, no or only a few alterations to the electrical conditions of the surrounding and the transmission, bendings and twistings of the connector between chuck and signal preamplifier (signal cable) or other signal interfering events occur. To use this effect as much as possible, the distance between signal preamplifier and chuck as well as the signal cable is kept as small as possible, preferably a few millimetres. The shortening of the signal cable has a positive effect in particular in a high frequency range because every movement of the connector in itself can lead to alterations of the signal.

While the noise sensitive section of the electrical connection between measurement unit and chuck is kept minimally stationary, the requirements on the section between signal preamplifier and measurement unit (measurement cable) are significantly diminished because the signal-noise-ratio is better in comparison to the signal cable. The amount of signals to be exchanged through the measurement cable lie within a range that is significantly above the noise level of electromagnetic interferences. In this way, it is possible to realize the connection to the outside to the measurement unit through a non-sensitive measurement cable, i.e. a cable that does not have special shieldings for low-current or low-voltage measurements such as with for instance coaxial or triaxial cables.

Due to changes of the position of the chuck and thus, of the signal preamplifier relative to the encasing housing, the non-sensitive measurement cable follows every movement of the chuck. A resultant influence on the transmitted signal has in this case because of the signal height though only a small impact. Because the position of the signal preamplifier relative to the chuck stays the same, the relation of the signal preamplifier to the encasing housing though can change. In one embodiment of the invention, the measurement cable is a flexible cable while the signal cable is rigid.

In one embodiment, the chuck has a triaxial structure and has as described above electrically conductive elements to which force-, guard and shield-potential can be connected, and of which the topmost element, that can be kept at force-potential, forms the support surface of the chuck so that the force-element is connected with the signal preamplifier via the signal cable. Those elements can be arranged in the chuck as surface elements as successive layers from the wafer downwards with an insulating layer between two surface elements so that the surface elements are electrically insulated from each other. A surface element shall be understood to mean a component of the chuck that extends sheet-like in its size and structure, so that a shielding of the wafer is realized.

Different embodiments can be used as the signal preamplifier dependent on the kind and the height of the signal. In several embodiments, they can have a coaxial or a triaxial, or a single-wire structure. Accordingly, the chuck facing input or output terminal of the signal preamplifier, which because of its potential features as input as well output terminal of the signal preamplifier shall be generally designated as signal port, has either only an interface for the measurement signal (single-wire embodiment), or also an interface for shield-potential (coaxial embodiment), or in addition an interface for guard-potential (triaxial embodiment).

The various embodiments make it possible to use at the signal port of the signal preamplifier existing guard- or shield-interface for an adequate provision of potential to the components inside of the probe station.

In connection with a triaxial chuck, the above described low-noise and according to the embodiment rigidly realizable connection between chuck and signal preamplifier can also be used for the coaxial or triaxial embodiment by connecting force-, guard- and shield-elements of the chuck with the signal port. Alternatively, the chuck can only comprise force- and shield-elements with a coaxial signal preamplifier.

In connection with a probe support plate which itself entirely or at least one layer consists of conductive material, or retains a separate, electrically conductive shielding plate, a triaxial signal port can likewise be used to integrate the probe support plate in the triaxial measurement structure. Because, the probe support plate or if necessary a shielding plate lies directly opposite the support surface of the chuck and thus, on the surface arranged wafer, they serve as guard and via the connection with the guard-interface of the signal port are kept at an adequate potential.

The connection between the signal preamplifier, which moves with the chuck, with the probe support plate or the shielding plate depends amongst other things on their embodiment and on the extent of the movement of the chuck relative to said plate. So far the position in relation to the chuck can vary, e.g. through a stationary assembly inside the housing and movement of the chuck for positioning the wafer relative to the probes, either a flexible connection between signal port and probe support plate or rather shielding plate, or a connection that can be disconnected is possible. For the latter, it is advantageous to disconnect the connection if a relative movement takes place between the chuck and probe support plate or shielding plate, and to reconnect if the end position is reached. Regularly, this will be a measurement position in which the probes connect to an individual of several structures of contact pads on the wafer.

The stabilization of the signal transmission between the chuck and the measurement unit can relate, apart from the electromagnetically and mechanically induced interferences, also to thermal surrounding conditions. Often, for on-wafer-measurements or during the measurements, a change of thermal conditions takes place, e.g. with setting up a defined wafer temperature above or under room temperature, or with heating up the wafer as a result of the measurement.

Because of the proximity of the signal preamplifier to the chuck and to the wafer, it can be advantageous in such cases for the signal preamplifier to be thermally decoupled from its surrounding through inhibiting as much as possible or at least reducing potential thermal transfers. That can take place through a poor thermally conductive assembly inside the probe station and/or through a thermally radiating housing or surface of the signal preamplifier.

Complementing or alternatively according to another embodiment of the probe station, an active temperature control of the signal preamplifier can take place which can include cooling as well as heating up. In this way, the temperature and thus, in particular the electrical features of the signal preamplifier can be specifically adjusted. That can take place independently from adjusting the temperature of the wafer and the surrounding if the signal preamplifier has its own heating or cooling source.

DETAILED DESCRIPTION

Figure 1:
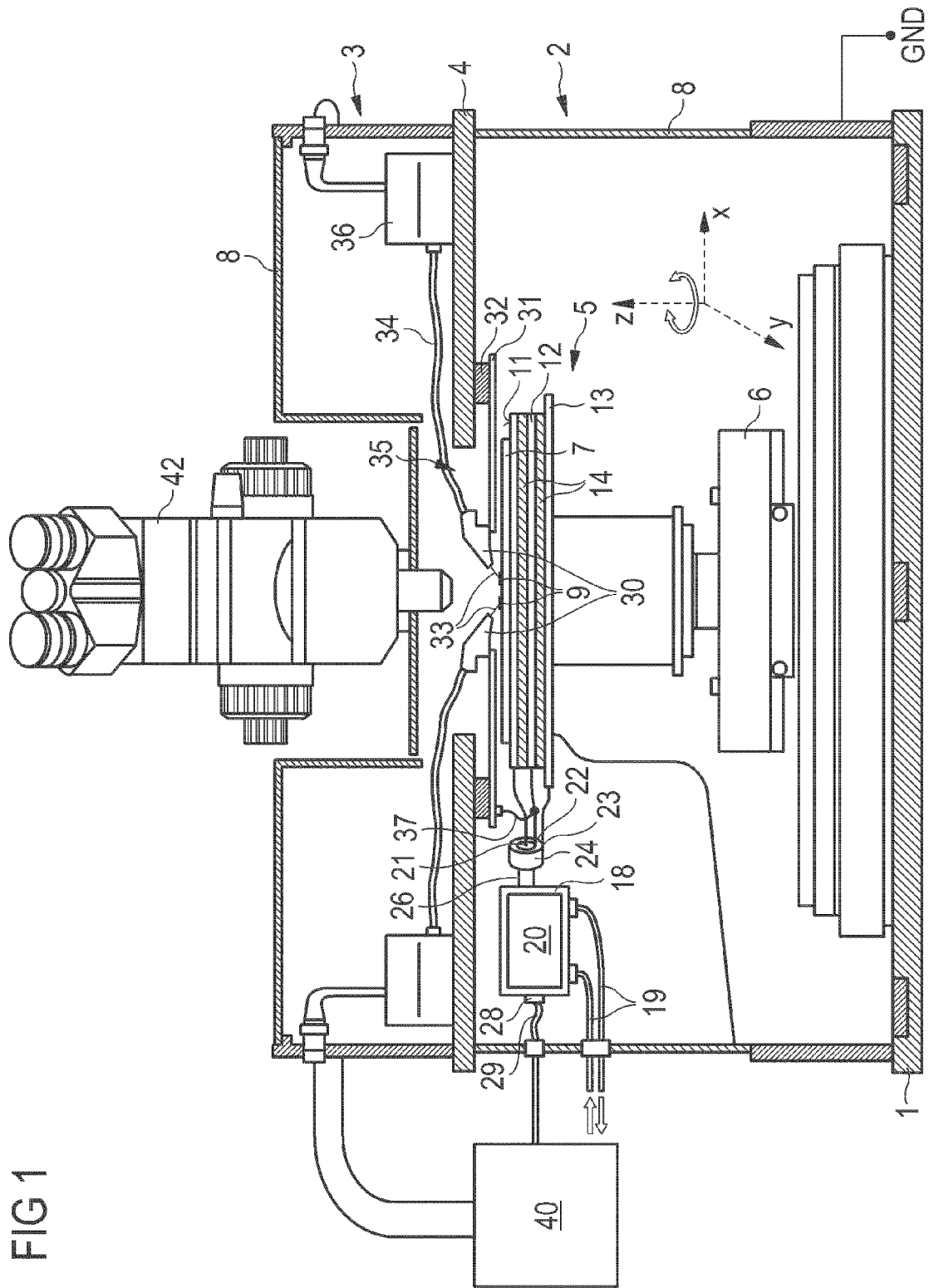
FIG. 1 shows, in a frontal sectioned representation, a probe station with single probes

An embodiment of a probe represented in FIG. 1 comprises a housing with two housing sections 2, 3. In the lower of the two housing sections, a chuck 5 is arranged on which a DUT 7, e.g. a wafer is laid and held. The chuck 5 comprises a chuck-positioning device 6 with which the chuck 5 can be moved in the x-direction, the y-direction, and the z-direction according to the defined coordinate system and can be turned about the z-axis within certain angular range. The chuck 5, including its chuck positioning unit 6, is mounted on a base plate 1 of the probe and encased by a housing wall 8.

The chuck 5 has a multi-layered construction that comprises five successive layers of electrically conductive and insulating layers. The topmost layer is electrically conductive and forms the force element and at the same time the support surface 11 of the chuck 5. Also, the middle and the bottom layer are electrically conductive and form the guard substrate 12 and the shield element 13. The layers lying in-between are insulation layers 14 which electrically insulate the support surface 11 from the guard element 12 as well as the guard element 12 from the shield substrate 13. The force, guard and shield elements 11, 12, 13 form in connection with the corresponding electrical potential a triaxial constructed chuck 5.

Arranged lying opposite the chuck 5 and at the same time opposite the DUT 7 is a probe support plate 4 which closes the lower housing section 8 at the top and thus, forms the lower housing section 2. The lower housing section 2 encases the chuck 5, the chuck-positioning device 6, and the DUT 7. The lower housing wall 8, the base plate 1, and the probe support plate 4 consist of an electrically conductive material and realize together with the described triaxial chuck 5, the EMI shielding of the DUT 7.

Directly adjacent to the chuck 5 with a distance of a few millimeters and thus, within the lower housing section 2, a signal preamplifier 20 is arranged and mechanically connected with the chuck 5 in a way that it participates in each of the movements of chuck 5.

The signal preamplifier 20 is triaxially constructed, so that its chuck facing triaxial signal port 24 has a central measurement signal interface 21 (force-interface) that is concentrically arranged to the outer shield interface 23, and also concentrically to the an intermediate guard-interface 22.

The individual electrical connections 21, 22, 23 are connected via a triaxial electrical connector 26, designated as signal cable 26 in this position, with the corresponding elements 11, 12, 13 of the chuck to connect the force element 11 to the measurement potential, the guard element 12 with the same guard potential, and the shield element 13 with the shield potential, here ground (GND). The signal cable 26 is realized as a rigid conductor of a few millimeters length, so that it bridges on a direct way the distance between signal preamplifier 20 and chuck 5.

In the representation of FIG. 1 and likewise in the below described FIG. 2, the distance from the signal preamplifier 20 to the chuck 5 is represented magnified for a better illustration. Also, the single electrical conductive and insulating layers of the chuck 5 are merely represented schematically to be able to illustrate the principal construction. Therefore, the proportions as seen in the figures are not consistent with the actual proportions. For that reason, the signal cable 26 is not represented as a consolidated conductor, but only its individual phases for illustrating the electrically jointly connected components.

A second port of the signal preamplifier 20, distinguishably designated as measurement port 28, is electrically connected with a further electrical connector 29, distinguishably designated as measurement cable 29, with a measuring unit 40, arranged outside of the housing 8, for controlling and analysing the measurement. The housing opening for cable 29 is realized by EMI-shielding contacts appropriate to the external measuring unit. The measurement cable 29 may be a single wire construction because, due to the improved signal-noise-ratio in this section, the signal transmission is significantly less sensitive to interference from external electromagnetic influences. The measurement cable 29 is flexible and can follow changes of positions of the signal preamplifier 20 in this way. This feature of the measurement cable 29 is symbolized in FIG. 1 and FIG. 2 through a wavy representation of the cable.

The signal preamplifier 20 is encased by a double-shell wall 18 through which can be made to flow a temperature controlled fluid. Through the schematically represented fluid inflow and fluid outflow 19, which may be flexible to permit signal preamplifier 20 to move together with chuck 5, a gaseous or a liquid fluid is led through the wall 18 which is warmed up or cooled down to a defined temperature to adjust the signal preamplifier 20 to a constant temperature independent from the chuck temperature. Alternatively, the signal preamplifier 20 can also be connected to a radiator to set up/adjust a defined temperature above the temperature in the probe.

The upper housing section 3, whose housing 8 also consists of electrically conductive material for EMI shielding of the components arranged therein, extends above the probe support plate 4. The individual shielding system integrated parts of the upper housing section and the probe support plate 4 are electrically connected to one another via their surface contacts so that a closed shielding is achieved.

In the probe support plate 4, a central opening 35 is arranged through which the probes 33 electrically contact the DUT 7. The central opening 35 of the probe support plate 4 is closed via a shielding plate 31 as far as the arrangement of the probes allows.

The shielding plate 31 extends between the probe support plate 4 and the DUT 7 and only has an opening in the immediate area of the contacting of the DUT 7 by the probes 33. Because shielding plate 31 complements the EMI-shielding of the probe support plate, the shielding plate 31 also consists of an electrically conductive material and is mounted on the probe support plate 4 by spacers 32. In one embodiment, the spacers comprise electrically insulating material.

The probes 33, which in the exemplary embodiment according to FIG. 1 are mounted onto the shielding plate 31 as individual probes in an arrangement corresponding to the contact pads 9 of the DUT 7 by means of probe supports 30, extend in the represented measurement position through the opening in shielding plate 31 onto the DUT 7. Via probe lines 34, the probes are connected with devices for signal preparation 36 in the upper housing section 3 and via those are connected with the measurement unit 40. Alternatively, the devices for signal preparation 36 in the upper housing section 3 can be omitted.

In the embodiment according to FIG. 1, the shield-element 13 of the chuck 5 is electrically connected with the housing 8 and is kept at ground-potential. The guard-element 12 is electrically connected with the shielding plate 31, so that the DUT 7 on both sides is shielded with a guard-potential kept component. The connection between guard-element 12 and shielding plate 31 is realized through a connector for the realization of the electrical connection by a connecting element 37 which in the represented measurement position is connected on both ends. If the chuck 5 and thus, the signal preamplifier 20 are to be moved for connecting other arrangements of contact pads 9 on the DUT 7, the connection of the connecting element 37 to the shielding plate 31 will be disconnected without opening the housing. The movement is carried out until the next measurement position is reached and subsequently, the connection will be reconnected.

The positioning of the probes 33 onto the contact pads 9 and the measurement can be monitored by a monitoring device 42 which is aimed at the tips of the probes 33.

Figure 2:
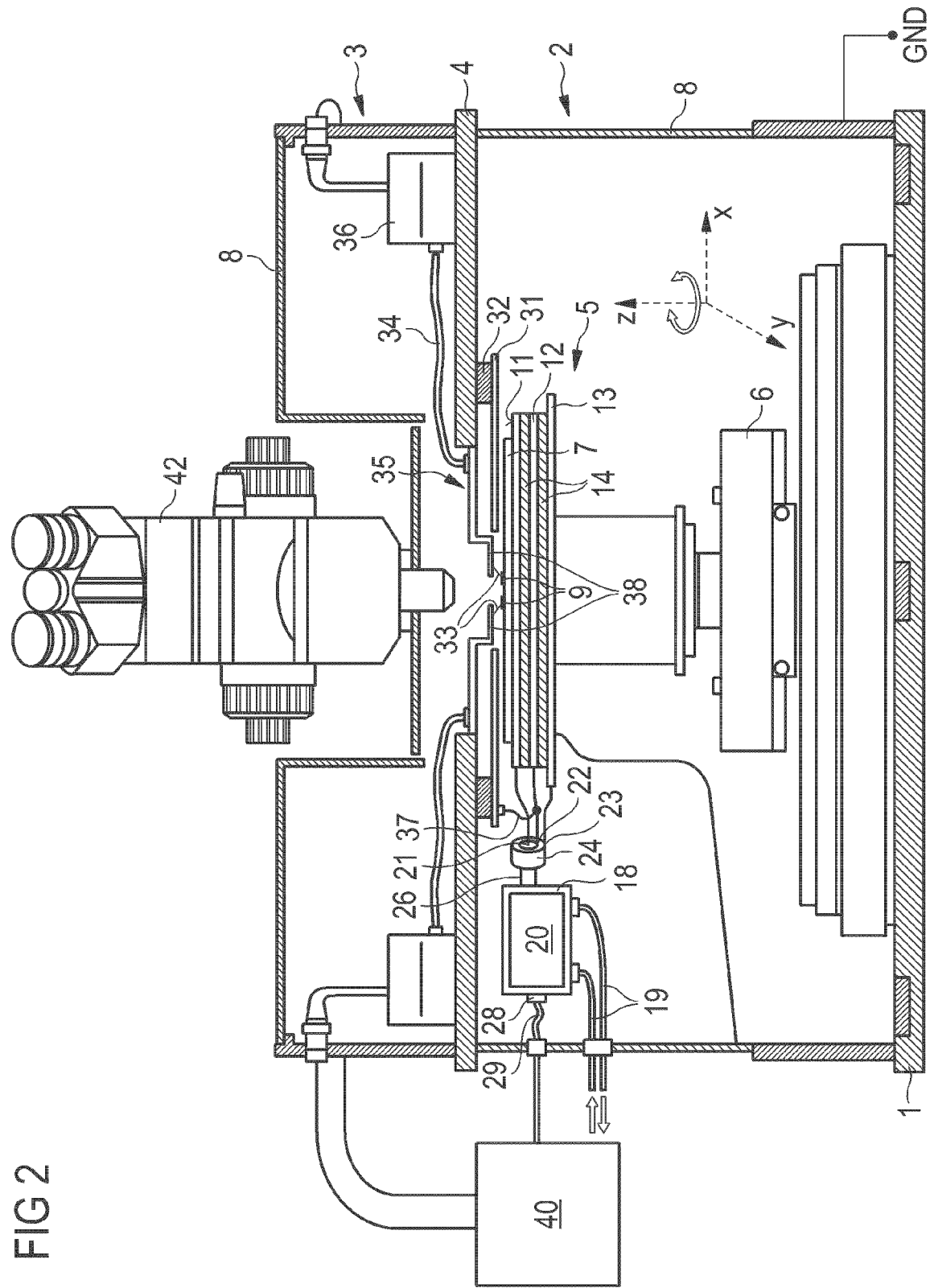
FIG. 2 shows, in a frontal sectioned representation, a probe station with probes mounted on a probe card.

FIG. 2 represents an embodiment in which the individual probes with probe supports 30 are replaced by a probe card

38. The probe card 38 is a conductor plate on which the needle-like probes 33 are mounted stationary, i.e. without probe supports, and electrically connected by conductor channels formed on the conductor plate. The arrangement of the probes 33 is here also consistent with the arrangement, in one measurement position, of the contact pads 9 to be simultaneously connected. In this embodiment, in the central opening 35, an adapted probe card 38 is mounted, if necessary, which closes the opening apart from a central passage way for monitoring.

The remaining construction of the probe station of FIG. 2 is consistent with the above description of FIG. 1 in which the same components are labelled with the same reference numerals. In this regard, reference is made to the description above.

The invention claimed is:

1. Arrangement for testing a DUT on a semiconductor substrate, comprising:
   a chuck having a support surface for receiving a semiconductor substrate to be tested, the support surface being at least in sections electrically conductive to connect the support surface to a certain electrical potential, or for electrically connecting the DUT,
   an electromagnetic shielding housing enclosing at least the chuck;
   at least one positioning device for positioning the chuck,
   a signal preamplifier arranged inside the housing adjacent to the chuck and having a signal port facing the chuck and electrically connected with the support surface,
   the signal preamplifier being moved together with the chuck by the at least one positioning device in a way that holds constant position of the signal preamplifier relative to the chuck during chuck positioning, and
   a measurement unit outside the housing, the measurement unit being connected with the signal preamplifier via a measurement cable.

2. Probe station according to claim 1, wherein the chuck has a triaxial structure with
   an, at least in sections, electrically conductive first surface element, designated as a force-element, which forms the support surface,
   an underneath located electrically conductive second surface element, designated as a guard-element and electrically insulated from the force-element, and
   an under the guard-element lying electrically conductive third surface element, designated as a shield-element and electrically insulated from the force-element and the guard-element.

3. Probe station according to claim 2, wherein the signal port of the signal preamplifier is structured coaxially or triaxially, and the shield-element, or the shield-element and the guard-element are connected to the signal port applied guard- and/or shield-potentials.

4. Probe station according to claim 3, further comprising
   a probe support plate for support of probes that serve for electrically connecting to pads on a front side of a DUT, wherein the housing also encloses the probe support plate, and the probe support plate is electrically conductive, or has a shielding plate opposite the support surface of the chuck, and the probe support surface or the shielding plate are kept at guard-potential for electrical connection by an electrically connecting element.

5. Probe station according to claim 4, wherein the probe support plate is supplied with signal port applied guard-potential by a connecting element.

6. Probe station according to claim 4, wherein said connecting element is disconnected from the probe support or the shielding plate, and/or from the signal port while the chuck is moved relative to the probe support plate or the shielding plate, and establishes an electrical connection after movement is finished.

7. Probe station according to claim 1, wherein the signal preamplifier is connected with the measurement unit via a flexible electrical connector, and with the chuck via a rigid electrical connector.

8. Probe station according to claim 1, wherein the signal preamplifier is thermally insulated from its surrounding.

9. Probe station according to claim 1, wherein the signal preamplifier comprises means for setting a temperature of the signal preamplifier.

* * * * *